United States Patent [19]

Taylor

[11] Patent Number: 5,266,059
[45] Date of Patent: Nov. 30, 1993

[54] GENERIC ROTATABLE CONNECTOR ASSEMBLY FOR TESTING INTEGRATED CIRCUIT PACKAGES

[75] Inventor: David Q. Taylor, Colorado Springs, Colo.

[73] Assignee: Hewlett-Packard Company, Palo Alto, Calif.

[21] Appl. No.: 941,582

[22] Filed: Sep. 8, 1992

[51] Int. Cl.⁵ ............................................. G01R 1/06
[52] U.S. Cl. ................................ 439/912; 324/158 P
[58] Field of Search ..................... 439/912, 68, 70, 71, 439/72, 67; 324/158 F, 158 P

[56] References Cited

U.S. PATENT DOCUMENTS

| | | | |
|---|---|---|---|
| 4,460,236 | 7/1984 | Strautz | 439/525 |
| 4,757,256 | 7/1988 | Whann et al. | 324/148 P |
| 4,830,623 | 5/1989 | Owens et al. | 439/71 |
| 4,835,469 | 5/1989 | Jones et al. | 324/158 P |
| 4,837,622 | 6/1989 | Whann et al. | 324/158 P |
| 4,975,638 | 12/1990 | Evans et al. | 324/158 P |
| 4,993,954 | 2/1991 | Prevost | 439/68 |
| 5,057,023 | 10/1991 | Kabadi et al. | 439/67 |
| 5,109,596 | 5/1992 | Driller et al. | 324/158 P |

OTHER PUBLICATIONS

Holsopple, et al., "Increased Useable I/O Pins On A Substrate", IBM Technical Disclosure Bulletin, vol. 23, No. 7A, Dec., 1980.

Primary Examiner—Neil Abrams

[57] ABSTRACT

A rotatable generic connector assembly for testing an integrated circuit package has an integrated circuit connector that can be connected to the integrated circuit package leads in any of a plurality of possible orientations; a second connector having a pattern of electrical contacts arranged in a symmetrical pattern (e.g. a square grid) about a center point; a flexible circuit providing a plurality of conductors from the integrated circuit connector contacts to the second connector contacts; and a test equipment connector assembly having a pattern of electrical contacts for engaging the second connector contacts in any of a plurality of possible orientations. The odd symmetry of the pattern of contacts on the second connector allows the integrated circuit leads to be connected in the same order to the testing equipment connector regardless of the selected orientation of the integrated circuit connector in engaging the integrated circuit by selecting a corresponding predetermined one of the possible orientations for the test equipment connector in engaging the second connector. In addition, the test equipment connector can include an interchangeable transition board to provide an interface between the second connector contacts and a different contact pattern used by the test equipment.

9 Claims, 10 Drawing Sheets

GENERIC ROTATABLE CONNECTOR ASSEMBLY FOR TESTING INTEGRATED CIRCUIT PACKAGES

BACKGROUND OF THE INVENTION

1. Field of the Invention

The present invention relates generally to the field of connectors for testing integrated circuits. More specifically, the present invention discloses a connector that can be attached to an integrated circuit in any of a plurality of orientations to accommodate access or space limitations on the circuit board.

2. Statement of the Problem

It is often difficult to obtain clear access to an integrated circuit package for testing after it has been installed on a circuit board. It is often particularly difficult to attach the test equipment connector in the proper orientation to the integrated circuit package given tight space limitations. This problem is further compounded in situations where the circuit board is connected in a three-dimensional arrangement with other circuit boards. One solution in the past has been to use a conventional connector with a long flexible cable extending to the test equipment. This approach may suffice in some circumstances, but suffers from the ultimate limitation that sufficient space must be available to attach the connector to the integrated circuit in the proper orientation. In addition, the length of the cable can result in excessive loading of the integrated circuit output leads.

A number of types of contacts and probes have been invented in the past for testing integrated circuits, including the following:

| Inventor | Patent No. | Issue Date |
| --- | --- | --- |
| Prevost | 4,993,954 | Feb. 19, 1991 |
| Evans, et al. | 4,975,638 | Dec. 4, 1990 |
| Whann, et al. | 4,837,622 | June 6, 1989 |
| Owens, et al. | 4,830,623 | May 16, 1989 |
| Whann, et al. | 4,757,256 | July 12, 1988 |

Holsopple, et al., "Increased Useable I/O Pins On a Substrate", IBM Technical Disclosure Bulletin (Vol. 23, No. 7A, Dec. 1980).

Prevost discloses a device for interconnection between an integrated circuit and an electrical circuit. The desired interconnections are provided by stacked insulating platelets. Each platelet is crossed by a number of conducting channels, either with or without offset.

Evans, et al., disclose a test probe assembly to test integrated circuits. The device includes a contactor formed of flexible film material having probe contacts formed on the undersurface in a pattern matching contacts of the integrated circuit.

The patents to Whann, et al., disclose a high density probe card for test equipment to contact and test unsevered large scale integrated circuit dies formed on a semiconductor wafer. The probe card uses a probe array having an annular form with two sets of wire probes arranged in two interleaved conical patterns.

Owens, et al., disclose a connector arrangement for electrically interconnecting first and second arrays of pad-type contacts.

Holsopple, et al., disclose a device which increases the useable number of I/O pins for a silicon chip 12 mounted on an upper substrate member 10. The upper substrate member 10 is connected by an array of pins 24 and 26 to a lower substrate member 14 bearing a similar pattern of contacts and pins 16 and 18. Selected pins are electrically connected by metal lines 22.

3. Solution to the Problem

None of the prior art references uncovered in the search show a connector assembly that can be engaged to the integrated circuit package in any of a number of possible orientations to accommodate space and access limitations on the circuit board, while maintaining the order of the connections from the integrated circuit leads to the test equipment. In addition, the present invention includes a transition board that permits the connector assembly to be readily interfaced to test equipment using any of a variety of different contact patterns.

SUMMARY OF THE INVENTION

This invention provides a rotatable generic connector assembly having an integrated circuit connector that can be connected to an integrated circuit in any of a plurality of possible orientations; a second connector having a pattern of electrical contacts arranged in a symmetrical pattern (e.g. a square grid) about a center point; a flexible circuit providing a plurality of conductors from the integrated circuit connector contacts to the second connector contacts; and a test equipment connector assembly having a pattern of electrical contacts for engaging the second connector contacts in any of a plurality of possible orientations. The odd symmetry of the pattern of contacts on the second connector allows the integrated circuit leads to be connected in the same order to the testing equipment connector regardless of the selected orientation of the integrated circuit connector in engaging the integrated circuit by selecting a corresponding predetermined one of the possible orientations for the test equipment connector in engaging the second connector. In addition, the test equipment connector can include an interchangeable transition board to provide an interface between the second connector contacts and a different contact pattern used by the test equipment.

A primary object of the present invention is to provide a connector assembly that can be engaged to the integrated circuit in any of a plurality of orientations to accommodate space and access limitations commonly encountered on circuit boards.

Another object of the present invention is to provide a generic connector assembly that is not tied to any particular pin-out arrangement for the type of integrated circuit package handled by the connector. For example, a 132 pin QFP (quad flat pack) connector assembly can probe any type of 132 pin QFP package regardles of the pinout arrangement for the device.

These and other advantages, features, and objects of the present invention will be more readily understood in view of the following detailed description and the drawings.

BRIEF DESCRIPTION OF THE DRAWINGS

The present invention can be more readily understood in conjunction with the accompanying drawings, in which.

DETAILED DESCRIPTION OF THE INVENTION

Figure 1:
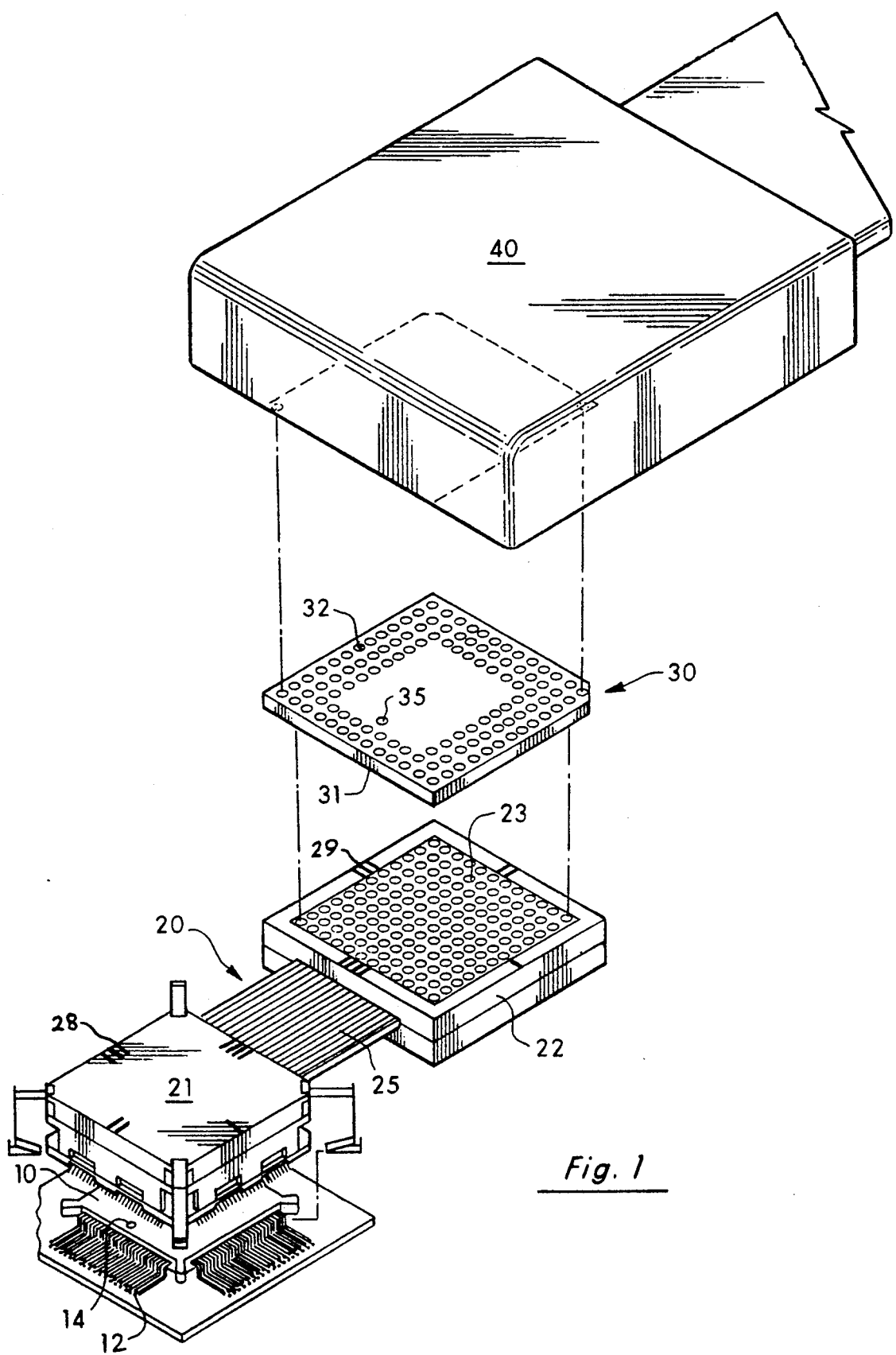
FIG. 1 is an exploded perspective view of the connector assembly over an integrated circuit package to be tested.
Figure 2:
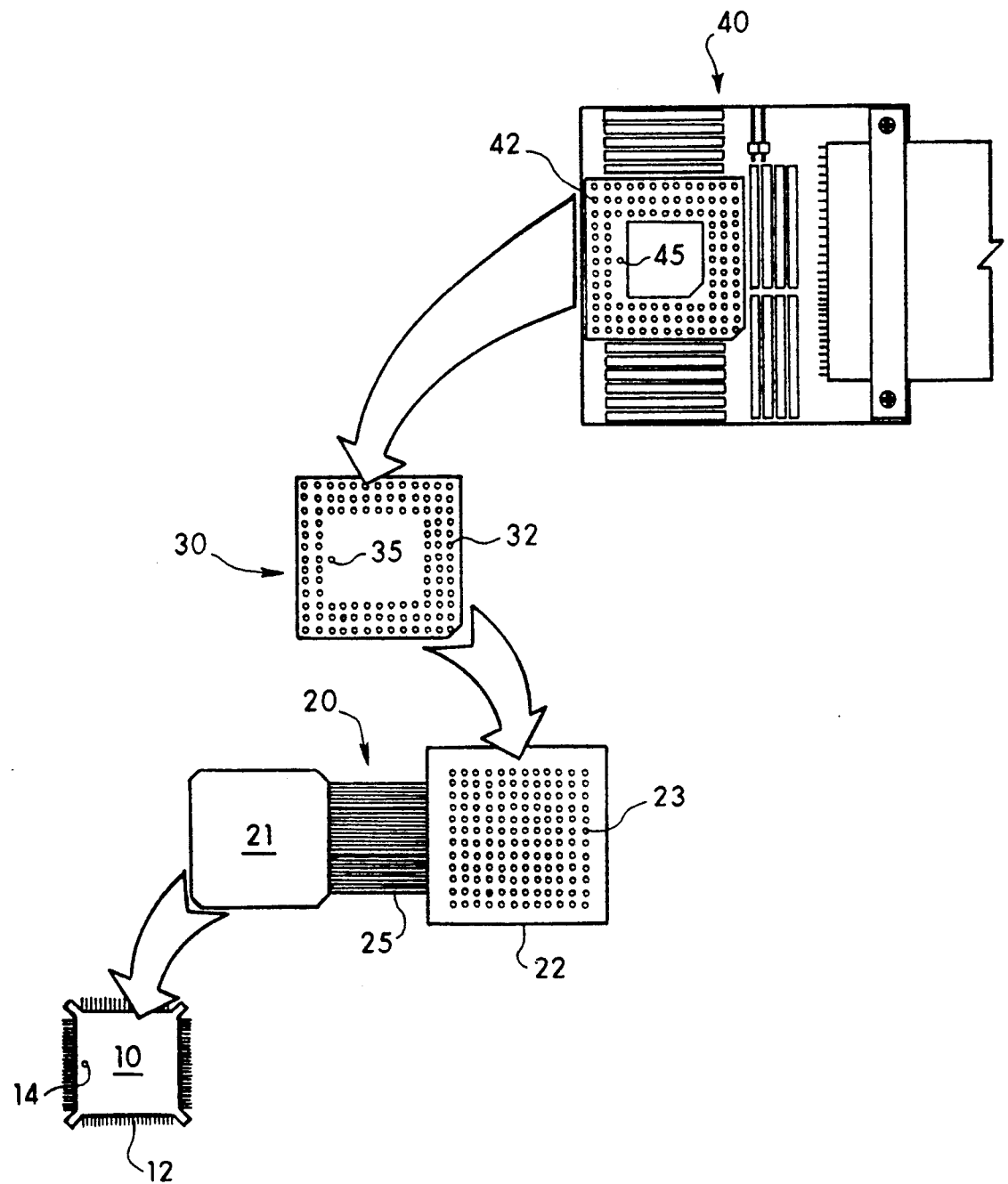
FIG. 2 is a simplified diagram showing the connector assembly attached to an integrated circuit in the first of four possible orientations.
Figure 3:
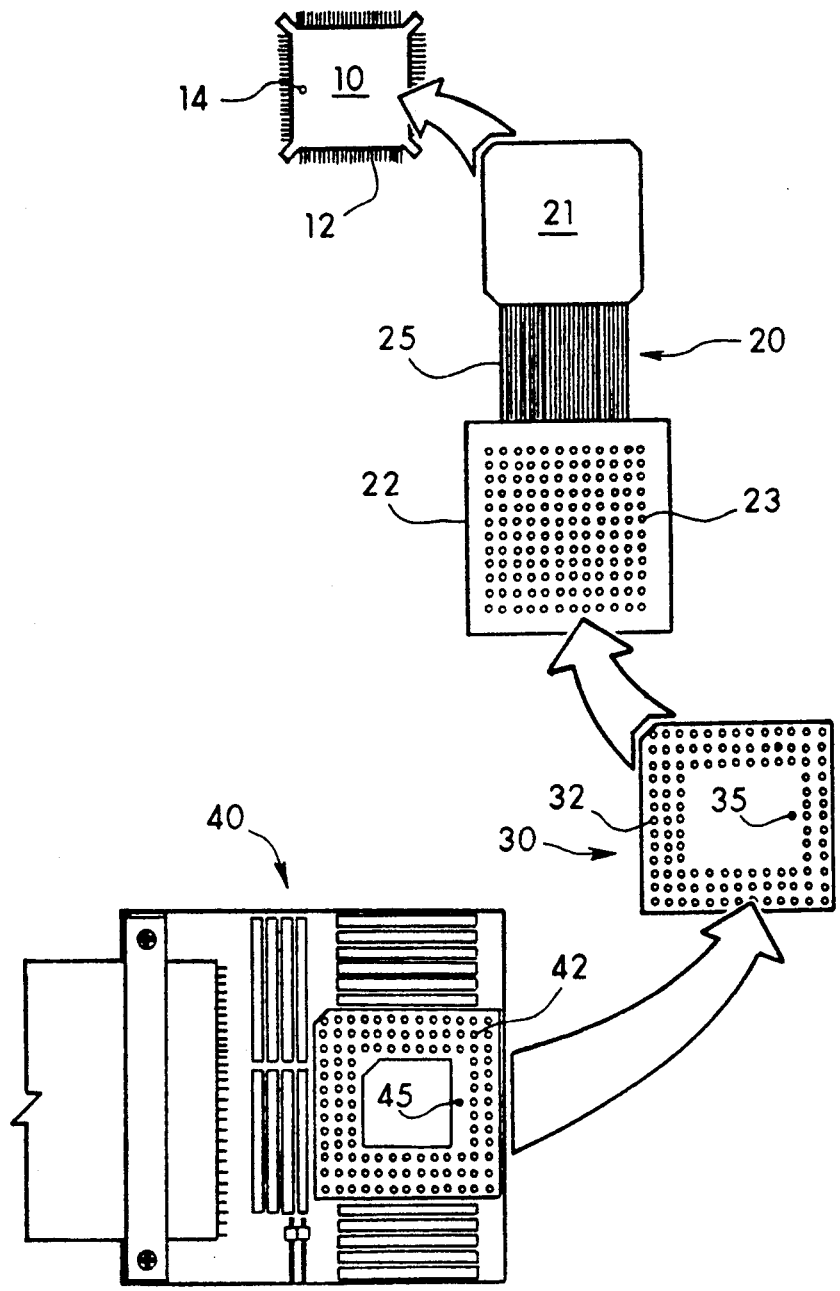
FIG. 3 is a simplified diagram showing the connector assembly attached to an integrated circuit in the second possible orientations.
Figure 4:
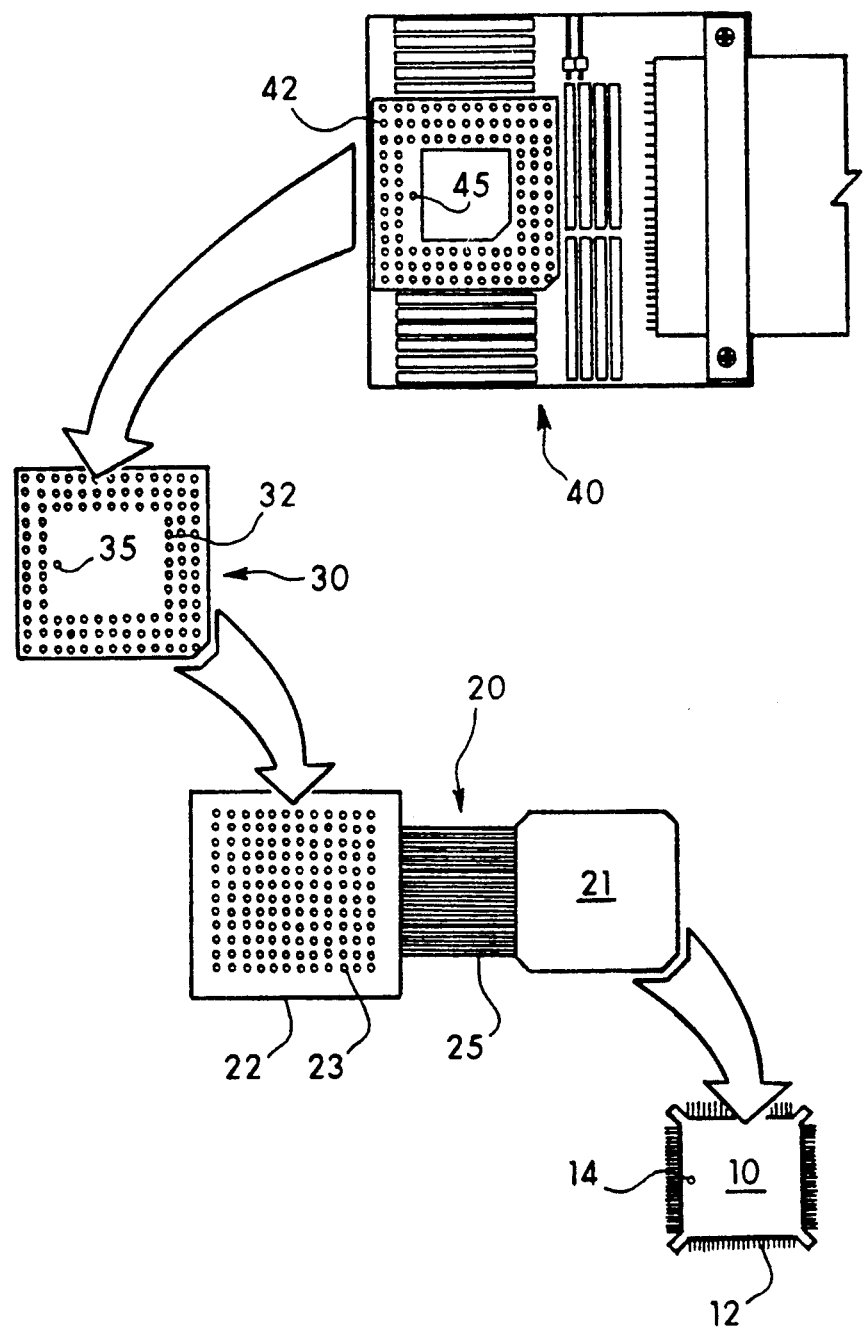
FIG. 4 a simplified diagram showing the connector assembly attached to an integrated circuit in the third of four possible orientations.
Figure 5:
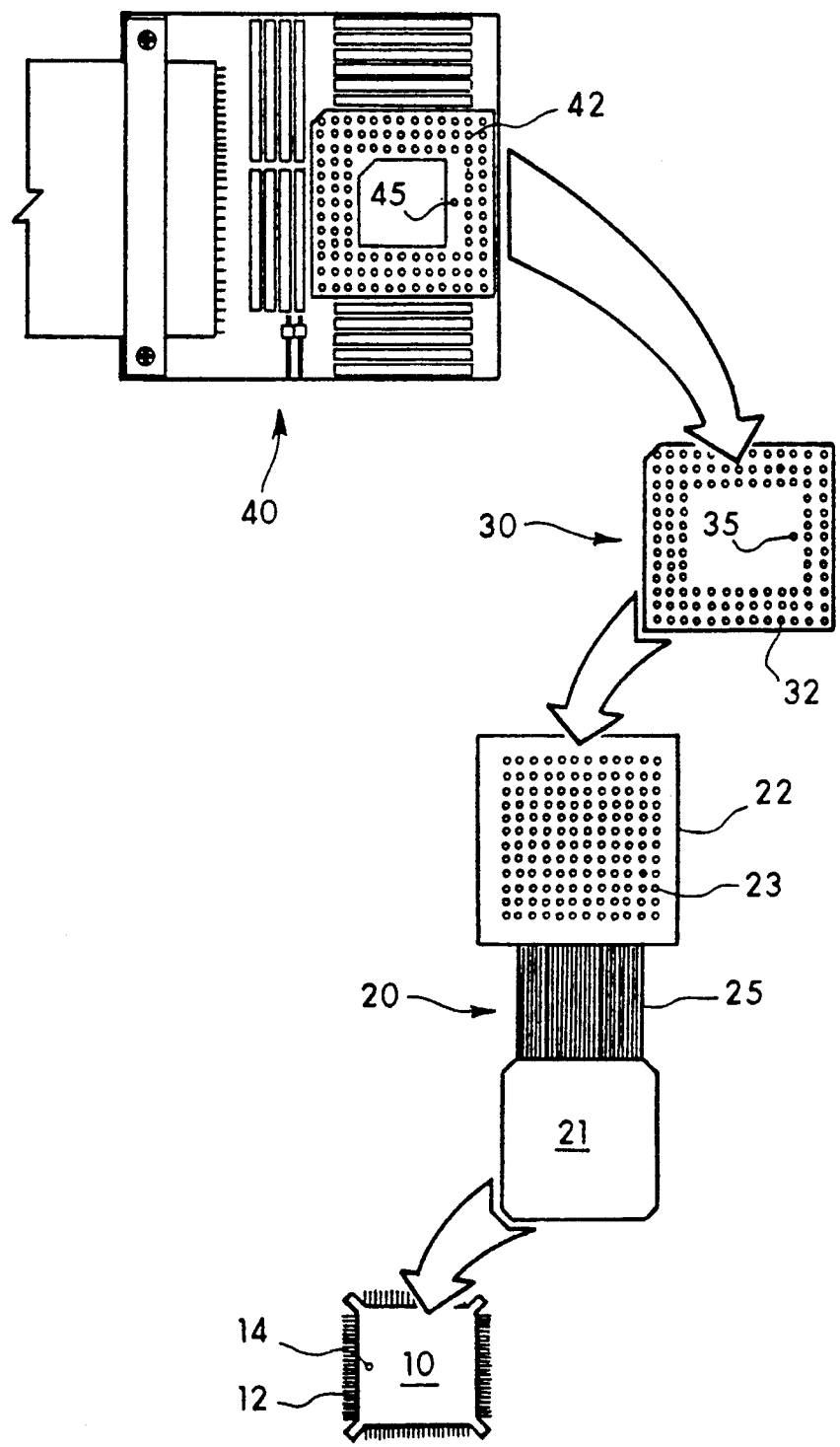
FIG. 5 is a simplified diagram showing the connector assembly attached to an integrated circuit in orientations.

Turning to FIG. 1, the present invention is shown in perspective view. The connector assembly 20 has an integrated circuit connector 21 that attaches over the leads 12 of the integrated circuit 10 to be tested. For example, the integrated circuit 10 depicted in FIG. 1 is a conventional 132-pin quad flat pack (QFP) integrated circuit package. The integrated circuit package has a substantially square shape with 33 leads extending from each of its four edges. The integrated circuit connector 21 has a corresponding set of electrical contacts that come into contact with each of the leads 12 of the integrated circuit package 10 as the integrated circuit connector is slipped over the integrated circuit in any of four possible orientations. A dot or other visual indicator 14 on the top surface of the integrated circuit 10 identifies the location of pin 1. The integrated circuit connector 21 includes visual indicators 28, such as hash marks, color coding or reference numbers, to show which of the four possible orientations has been employed relative to the dot 14.

The opposite end of the connector assembly 20 includes a second connector 22 having a plurality of electrical contacts 23. These contacts 23 are arranged in a symmetrical pattern about a center point. For example, the preferred embodiment shown in the drawings uses a 12 by 12 grid of contacts 23 to provide a standard PGA (pin grid array) interface for testing equipment. However, other symmetrical patterns can be employed. The pattern of contacts 23 on the second connector 22 is divided into four identically-shaped regions that are symmetrically disposed about the center point of the pattern.

The integrated circuit connector 21 and the second connector 22 are tied together by a short flexible circuit or cable 25. This flexible circuit 25 has a series of conductors running from each of the integrated circuit connector contacts to the second connector contacts 23.

In the preferred embodiment, the flexible circuit 25 is formed by stacking four discrete layers 70, 80, 90, and 100 shown in FIGS. 7 through 10. The first ends 71, 81, 91, and 101 of the these layers are aligned by pins in the integrated circuit connector 21 to provide electrical contact with the leads 12 of the integrated circuit 10. The second ends 74, 84, 94, and 104 of the layers are laminated together and connected by pins in the second connector to provide electrical connections with selected contacts 75, 85, 95, and 105 on the upper surface of the second connector 22. Each layer 70, 80, 90, and 100 has a plurality of conductors 73, 83, 93, and 103 mapping the contacts along one edge 72, 82, 92, and 102 of the integrated circuit 10 into one of the four regions of contacts 23 of the second connector 22, as shown in FIGS. 7 through 10.

Figure 6A:
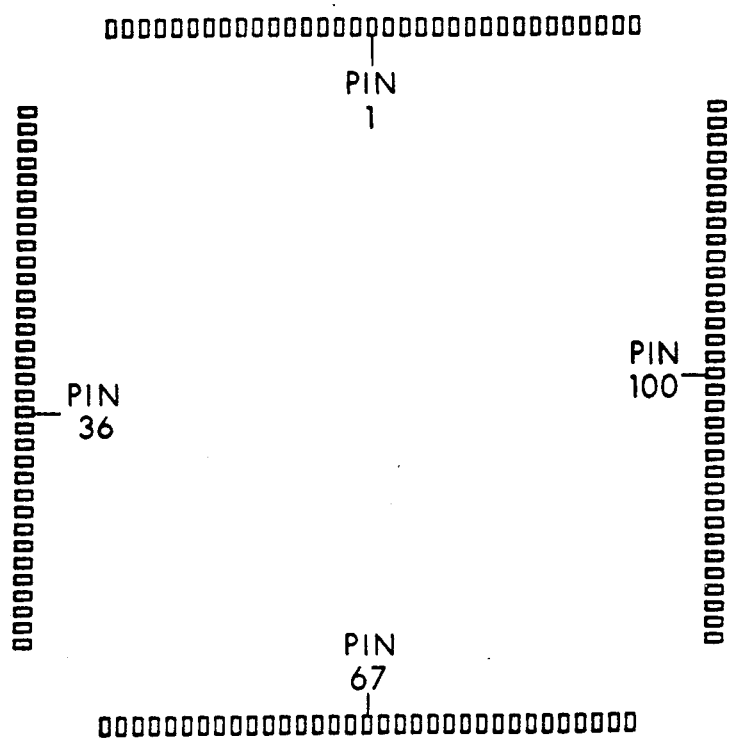
FIGS. 6A and 6B are sample diagrams showing signal mapping from the leads of an integrated circuit to the contacts of the second connector.
Figure 6B:
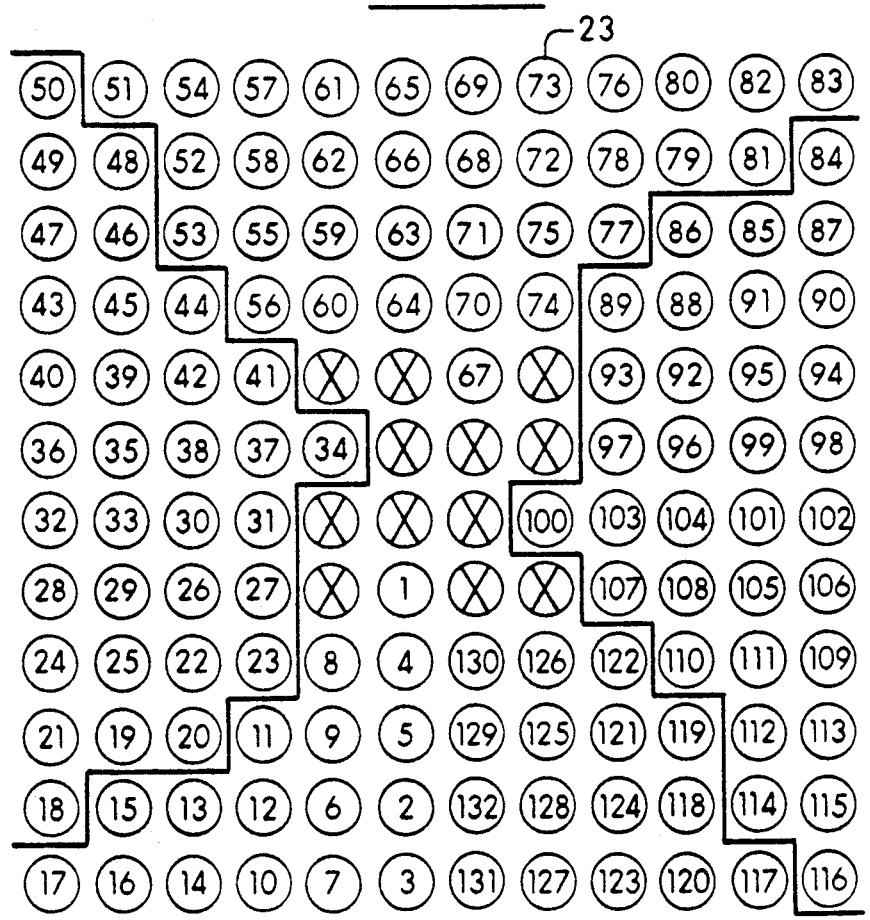
Figure 7:
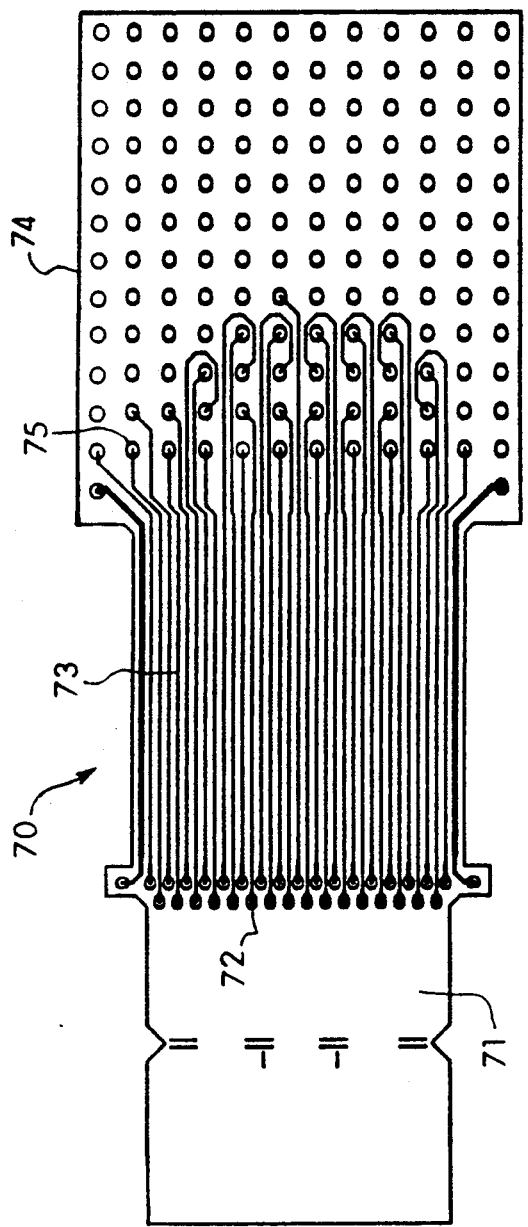
FIG. 7 top view of the first layer of the flexible circuit connecting the integrated circuit connector to the second connector contacts.
Figure 8:
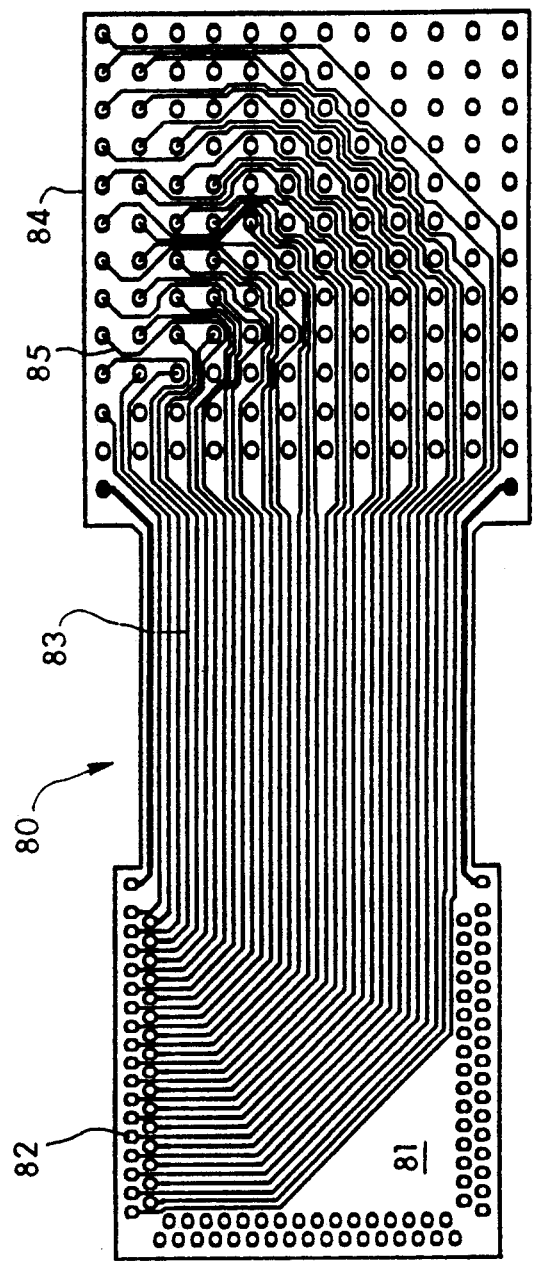
FIG. 8 a top view of the second layer of the flexible circuit connecting the integrated circuit connector to second connector contacts.
Figure 9:
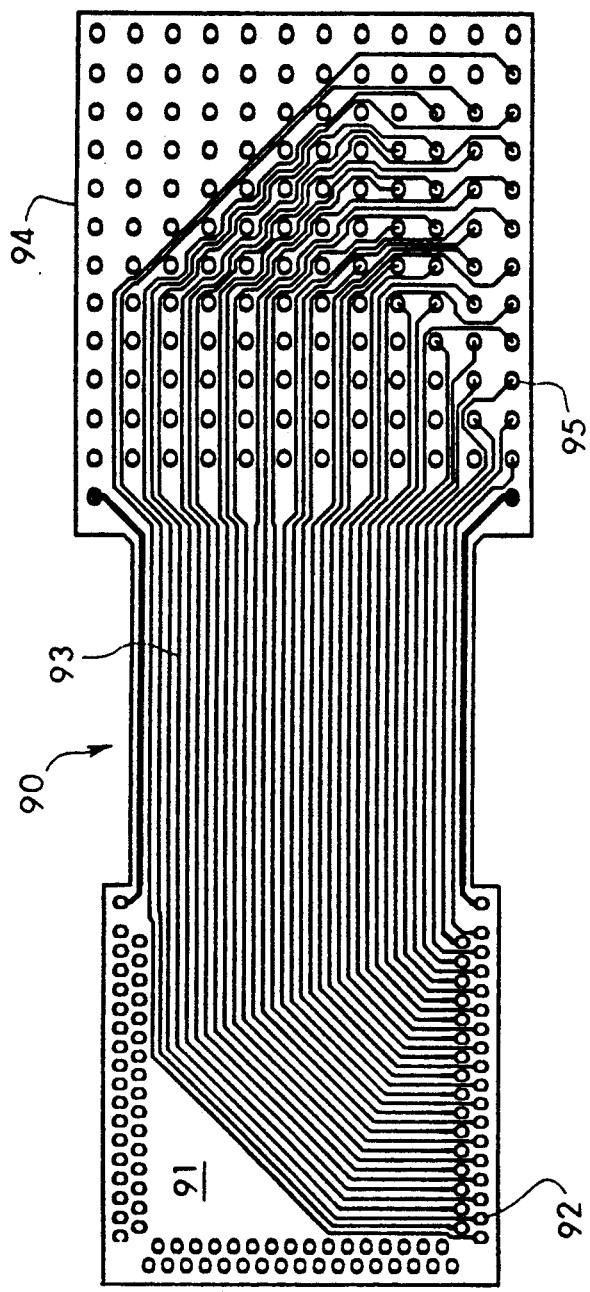
FIG. 9 is a top view of the third layer of the flexible circuit connecting the integrated circuit connector to the second connector contacts.
Figure 10:
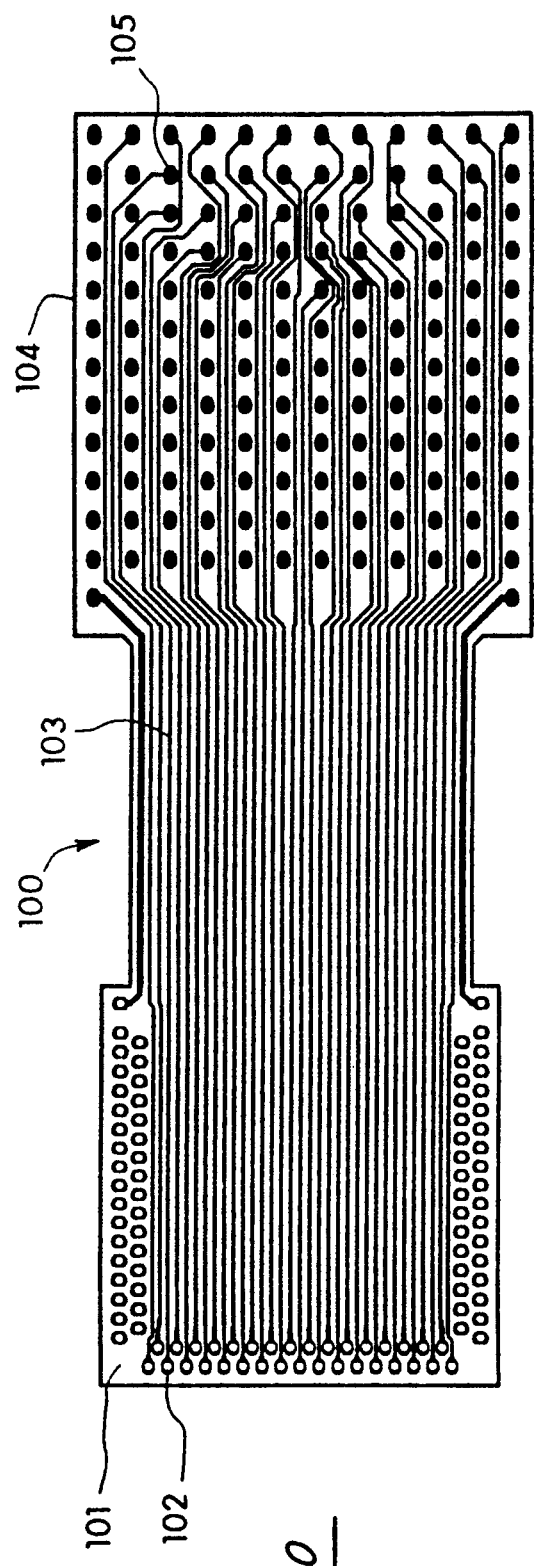
FIG. 10 is a top view of the fourth layer of the flexible circuit connecting the integrated circuit connector to the second connector contacts.

An example of the resulting map of connections is shown, in FIGS. 6A and 6B. FIG. 6A shows the conventional numbering scheme for a 132-pin QFP integrated circuit package. FIG. 6B shows the corresponding arrangement of the contacts 23 on the second connector 22. Note that each of the 132 pins of the integrated circuit is mapped into one of the 144 contacts 23 on the second connector 22 in a symmetrical pattern about the center of the grid. (Unused contacts marked with an "X" are tied to ground). This pattern can be described as a type of odd symmetry. For example, given a square integrated circuit package, the integrated circuit connector 21 can be attached in any of four orientations with respect to pin 1 of the integrated circuit 10 (i.e., 0, 90, 180, and 270 degrees). Each of the four possible orientations are shown in FIGS. 2 through 5. The resulting relative order of the contacts 23 on the second connector 22 rotates accordingly. For example, if the integrated circuit connector 21 is attached to the integrated circuit 10 as shown in FIG. 1, pin 1 will map into the contacts 23 of the second connector 22 as shown in FIGS. 6A and 6B. If the integrated circuit connector is rotated counter-clockwise by 90 degrees, pin 1 effectively becomes pin 34 and is mapped accordingly into the grid of contacts on the second connector. Similarly, successive additional 90 rotations effectively shift pin 1 to pin 67 and then to pin 100. In each case, the other contacts 23 on the second connector rotate accordingly so that their relative order is maintained in all four possible orientations.

The test equipment is connected by means of a test equipment connector 40 as shown in FIG. 1. In one embodiment, the test equipment connector 40 has a pattern of contacts 42 (i.e., a 12 by 12 grid) that permit it to be directly attached to the second connector 22. Alternatively, an interchangeable transition board 30 can be interposed to provide a custom interface between the second connector and the test equipment connector as shown in FIG. 1.

As with the connection between the integrated circuit 10 and the integrated circuit connector 21, it is physically possible to attach the test equipment connector 40 to the second connector 22 in any of four possible orientations. However, the user should select the proper orientation for attaching the test equipment connector to the second connector that results in correct ordering of the electrical connections between the integrated circuit pins 12 and the test equipment contacts 45 as shown in FIGS. 2-5. The proper orientation for the test equipment connector is dictated on a one-to-one basis by the selected orientation of the integrated circuit connector with respect to the integrated circuit. The markings 29 on the second connector shown in FIG. 1 provide a simple way of providing a visual indication to the user of the correct orientation for the test equipment connector. FIGS. 2 through 5 demonstrate each of these four combinations of orientations for the integrated circuit connector and test equipment connector.

Figure 11:
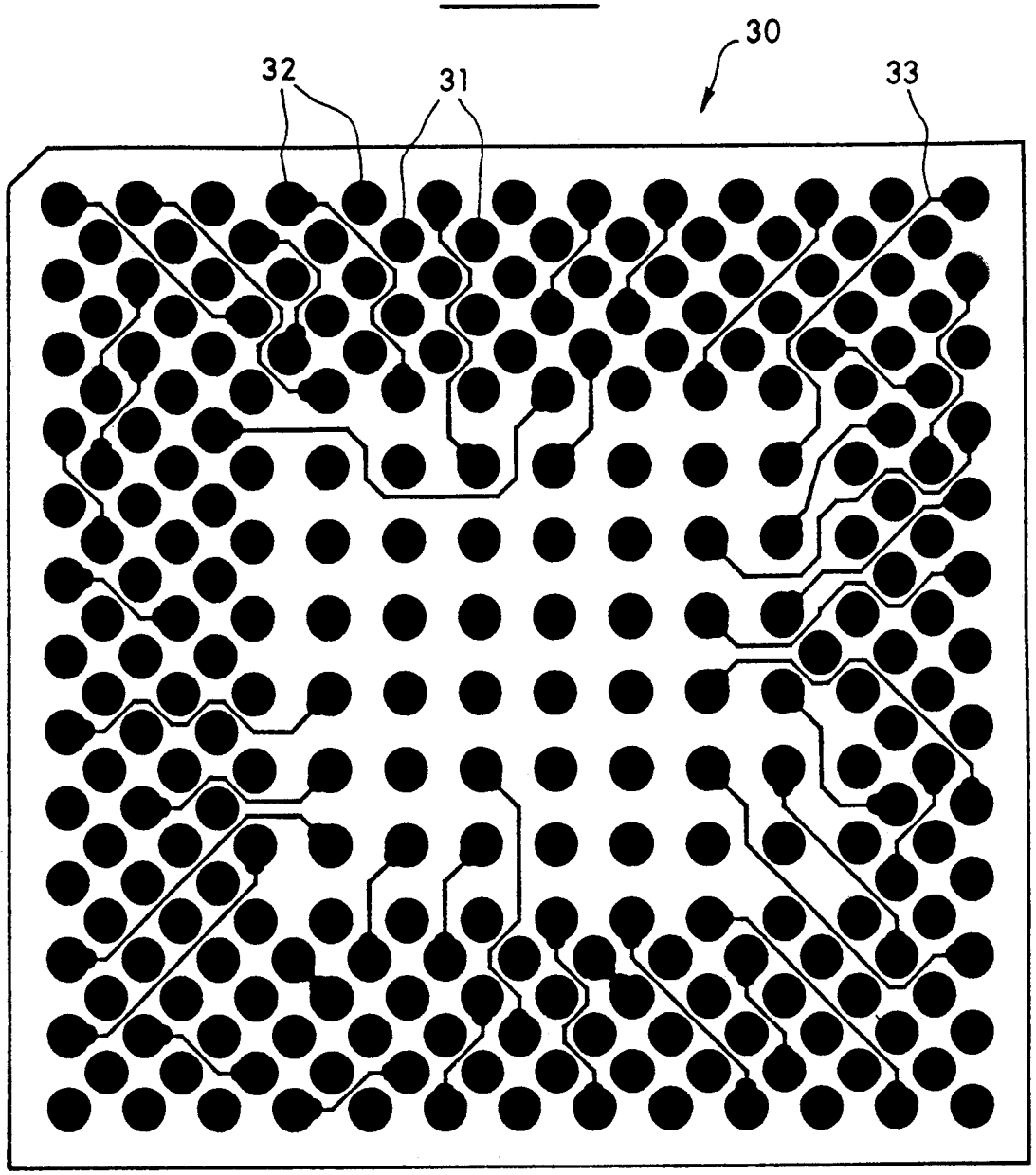
FIG. 11 is a top view of the first layer of interconnections of the contacts on a sample transition board.
Figure 12:
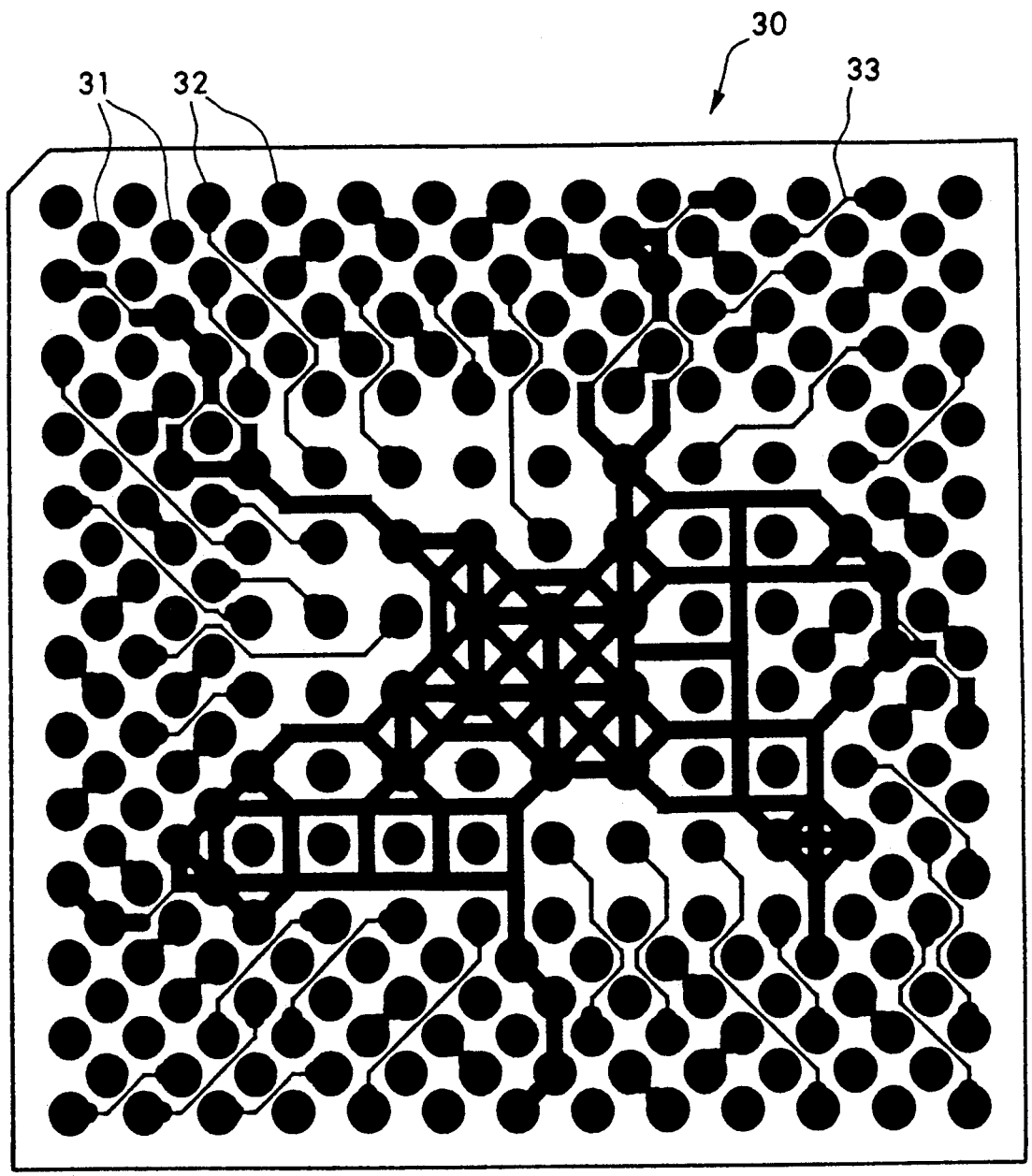
FIG. 12 is a top view of the second layer of interconnections of the contacts on a sample transition board.

FIGS. 11 and 12 provide further details of a sample transition board 30 for a Motorola 68020 microprocessor. The lower surface of the transition board 30 has a 12 by 12 grid of contacts 31 to attach to the corresponding grid of contacts 23 on the top of the second connector 22. The upper surface has a pattern of contacts 32 laid out in an incomplete 13 by 13 grid to engage the conventional pattern of contacts used in testing equipment for Motorola 68020 processors. A dot or other visual indicator 35 helps to ensure that the transition board 30 is attached to the equipment connector 40 in the proper orientation. The transition board is typically implemented as a multilayer printed circuit board with signal traces 33 interconnecting selected contacts 31 on the lower surface with selected contacts 32 on the upper surface to provide the desired interface protocol, as shown for example in FIGS. 11 and 12. Other interfaces can be readily accommodated simply by changing the transition board 30.

The above disclosure sets forth a number of embodiments of the present invention. Other arrangements or embodiments, not precisely set forth, could be practiced under the teachings of the present invention and as set forth in the following claims.

I claim:

1. A connector assembly for testing an integrated circuit package having a plurality of leads, said connector assembly comprising:
    an integrated circuit connector that can be connected to provide electrical contacts with at least some of said integrated circuit package leads in any of a plurality of possible orientations;
    a second connector having a pattern of electrical contacts arranged in a symmetrical pattern about a center point;
    a flexible circuit providing a plurality of conductors from said integrated circuit connector contacts to said second connector contacts and providing a lateral offset between said integrated circuit connector and said second connector;
    a test equipment connector assembly having a pattern of electrical contacts for engaging said pattern of second connector contacts in any of a plurality of possible orientations about said center point of said second connector, such that said integrated circuit leads can be connected in the same order to said testing equipment connector contacts regardless of the selected orientation of said integrated circuit connector in engaging said integrated circuit by selecting a corresponding predetermined one of the possible orientations for said test equipment connector in engaging said second connector; and
    at least one visual indicator to indicate proper orientation of said test equipment connector in engaging said second connector corresponding to the selected orientation of the said integrated circuit connector in engaging said integrated circuit.

2. The connector assembly of claim 1, wherein said second connector contacts are arranged in a square grid.

3. The connector assembly of claim 1, wherein said test equipment connector assembly has a fixed pattern of contacts and further comprises an interchangeable transition board having:
    a first surface with a first set of contacts to engage said second connector contacts;
    a second surface with a second set of contacts to engage said fixed pattern of contacts; and
    means for providing electrical connections between a set of said first surface contacts and a set of said second surface contacts.

4. A connector assembly for testing an integrated circuit package having a substantially square shape with a plurality of leads extending from each of its four edges, said connector assembly comprising:
    an integrated circuit connector having contacts that can be connected to said leads of said integrated circuit package in any of four possible orientation;
    a second connector having a pattern of contacts divided into four substantially identically shaped regions symmetrically arranged about a center point;
    a flexible circuit having conductors connecting said integrated circuit connector contacts with said second connector contacts and providing a lateral offset between said integrated circuit connector and said second connector, said integrated circuit leads for each edge being mapped in a consistent pattern into one of said regions of said second connector contacts;
    a testing equipment connector assembly having a pattern of electrical contacts for engaging said pattern of second connector contacts in any of four possible orientations; and
    at least one visual indicator to indicate the proper orientation for said test equipment connector to engage said second connector depending upon the selected orientation for said integrated circuit connector with respect to said integrated circuit so that said integrated circuit leads are connected in the same order to said testing equipment connector contacts.

5. The connector assembly of claim 4, wherein said test equipment connector assembly has a fixed pattern of contacts and further comprises an interchangeable transition board having:
    a first surface with a first set of contacts to engage said second connector contacts;
    a second surface with a second set of contacts to engage said fixed pattern of contacts; and
    means for providing electrical connections between a set of said first surface contacts and a set of said second surface contacts.

6. The connector assembly of claim 4, wherein said flexible circuit comprises four layers, each layer having conductors connecting contacts along one edge of said integrated circuit contacts with one of said regions of said second connector contacts.

7. The connector assembly of claim 4, wherein said second connector contacts are arranged in a square grid.

8. A connector assembly for testing an integrated circuit package having a substantially square shape with a plurality of leads extending from each of its four edges, said connector assembly comprising:
    an integrated circuit connector having contacts that can be connected to said leads of said integrated circuit package in any of four possible orientations;
    a second connector having a substantially square grid of contacts divided into four substantially identically shaped regions symmetrically arranged about a center point;

a flexible circuit with four layers, each layer having conductors mapping integrated circuit connector contacts along one edge of said integrated circuit into one of said regions of said second connector contacts;

a testing equipment connector assembly having a pattern of electrical contacts for engaging said pattern of second connector contacts in any of four possible orientations; and at least one visual indicator to indicate the proper orientation for said test equipment connector to engage said second connector depending upon the selected orientation for said integrated circuit connector with respect to said integrated circuit so that said integrated circuit leads are connected in the same order to said testing equipment connector contacts.

9. The connector assembly of claim 8, wherein said test equipment connector assembly has a fixed pattern of contacts and further comprises an interchangeable transition board having:

a first surface with a first set of contacts to engage said second connector contacts;

a second surface with a second set of contacts to engage said fixed pattern of contacts; and means for providing electrical connections between a set of said first surface contacts and a set of said second surface contacts.

* * * * *